United States Patent
Shibuya

[11] Patent Number: 5,561,552
[45] Date of Patent: Oct. 1, 1996

[54] OPTICAL FIBER AMPLIFIER UNIT AND METHOD FOR SUPPLYING EXCITED LIGHT THEREOF

[75] Inventor: Takashi Shibuya, Tokyo, Japan

[73] Assignee: NEC Corporation, Tokyo, Japan

[21] Appl. No.: 395,311

[22] Filed: Feb. 28, 1995

[30] Foreign Application Priority Data

Apr. 13, 1993 [JP] Japan ............................. 5-86006

[51] Int. Cl.⁶ ............................................. H01S 3/00
[52] U.S. Cl. .................................................. 359/341
[58] Field of Search ............................ 359/341; 372/6

[56] References Cited

U.S. PATENT DOCUMENTS 5,241,414  8/1993  Giles et al. ........................ 359/341
5,287,216  2/1994  Chirravuri et al. ................. 359/341
5,343,320  8/1994  Anderson .......................... 359/160
5,355,248  10/1994 Hadjifotiou ........................ 359/341
5,392,153  2/1995  Delavaux ........................... 359/341
5,406,411  4/1995  Button et al. ...................... 359/341

Primary Examiner—Mark Hellner
Attorney, Agent, or Firm—Sughrue, Mion, Zinn, Macpeak & Seas

[57] ABSTRACT

A first and a second optical fiber amplifiers are connected in series.via an optical isolator. Respective excited light from the first and the second excitation light sources are input to the input terminals of 2-input/2-output branching means to be unevenly divided for composition. Composite excited light is output to the first and the second WDM couplers.

20 Claims, 3 Drawing Sheets

OPTICAL FIBER AMPLIFIER UNIT AND METHOD FOR SUPPLYING EXCITED LIGHT THEREOF

BACKGROUND OF THE INVENTION

This invention relates to an art of optical fiber amplifier unit and, more particularly, to the optical fiber amplifier unit provided with a redundant structure for high reliability.

An examination has been made with respect to a long-distance optical communication system in which a plurality of optical fiber amplifier units as linear relays are connected stage-wise. The optical fiber amplifier unit used as a linear relay is required to yield high gain and yet low noise. Such unit has been proposed to have two optical fibers formed of quartz glass fibers doped with rare earth elements connected stage-wise therein. (Ishio, et. al., "Optical amplifier and its application" Ohm-sha, 1992, p. 121)

FIG. 3 shows an example of a construction of the two-staged optical fiber amplifier unit.

This optical fiber amplifier unit has a first optical fiber amplifier 11a and a second optical fiber amplifier 11b connected in series via an optical isolator 12.

The first optical fiber amplifier 11a comprises a first optical fiber 13a made of a quartz glass fiber doped with erbium, a first wavelength-division multiplexing (hereinafter referred to as WDM) coupler 14a, and a first excitation light source 15a for supplying excited light to the first WDM coupler 14a for amplification.

The second optical fiber amplifier 11b comprises a second optical fiber 13b made of a quartz glass fiber doped with erbium, a second WDM coupler 14b, and a second excitation light source 15b for supplying excited light to the second WDM coupler 14b for amplification.

Among the above components of the optical fiber amplifier unit such as the excitation light source, optical fiber, WDM coupler, optical isolator, and the like, the excitation light source serves to control the reliability of the unit. In order to improve the unit reliability, the first and the second excitation light sources 15a and 15b shown in FIG. 3 may be formed into a redundant structure.

FIG. 4 shows a two-staged optical fiber amplifier unit with the excitation light source formed into the redundant structure. The components in FIG. 4 that are the same as those in FIG. 3 are provided with the same reference numerals, thus omitting their explanations.

This optical fiber amplifier unit has a first optical fiber amplifier 21a and a second optical fiber amplifier 21b connected stage-wise therein via an optical isolator 12. The first optical fiber amplifier 21a is composed of a first optical fiber 13a made of a quartz glass fiber doped with erbium, a first WDM coupler 14a, and a first polarization composite unit 23a for supplying excited light to the WDM coupler 14a for amplification, and two units of first excitation light sources 24a and 25a for polarization composite in the first polarization composite unit 23a.

The second optical fiber amplifier 21b is composed of a second optical fiber 13b made of a quartz glass fiber doped with erbium, a second WDM coupler 14b, and a second polarization composite unit 23b for supplying excited light to the WDM coupler 14b for amplification, and two units of second excitation light sources 24b and 25b for polarization composite in the second polarization composite unit 23b.

The above redundant structure through polarization composite in the latter type of the optical fiber amplifier unit is designed to be used in the conventional submarine relay unit. This is one of general redundant structures applied to the light source. More specifically, it is described in "LD redundant structure using polarization components for a submarine optical transmission system" (S. TSUTSUMI, et. al., J Lightwave Technol. Vol., LT-2, No. 6, pp.980–986, December 1984)

Both types of optical fiber amplifier units shown in FIGS. 3 and 4 require two excitation light sources to one optical fiber to be formed into the redundant structure.

Another type of the optical fiber amplifier unit has been disclosed in Japanese Patent Laid-Open No. 241073 (1990), in which two excitation light sources are provided so that one excitation light source replaces the other which gets out of order.

FIG. 5 is a figure showing a redundant structure disclosed in the Japanese Patent Laid-Open No.241073 (1990).

In this figure, a reference numeral 30 is an optical fiber made of a quartz glass fiber doped with erbium, reference numerals 31 and 32 are light sources for pumping light, reference numerals 33 and 34 are lightwave composition/division unit for synthesizing and dividing pumping light and signal light, a reference numeral 35 is signal light, a reference numeral 36 is a light-interceptor for converting the signal light 35 to an electric signal, a reference numeral 37 is a determinator for determining "open" when the level of signal light 35 has been less than a predetermined level and a reference numeral 38 is a received output signal.

In this redundant structure, the optical fiber 30 is excited with the light source for pumping light 31. When the receiving side has found using the determinator that the light source for pumping light 31 is out of order, it stops the light source for pumping light 31 and excites the optical fiber 30 using the light source for pumping light 32.

Moreover, the Japanese Patent Laid-Open No.241073 (1990) discloses another redundant structure shown in FIG. 6.

A redundant structure shown in FIG. 6 is configured by adding light-wave dividers 42 and 43 of which branching ratio is set (to 1:99, for example) so as to minimize pumping light supplied to the light-interceptors 40 and 41.

In this redundant structure, pumping light output from the light source for pumping light 31 is converted to an electric signal in the light-interceptors 40 and 41, the determinator 37 conducts determination using this electric signal. Then, based on the determination, another light source for pumping light 32 is turned on.

However, forming the excitation light sources into the redundant structure in the conventional optical fiber amplifier unit described above increases the number of light sources and the cost, complicates its construction and results in unnecessarily enlarging the system.

SUMMARY OF THE INVENTION

It is an object of the present invention to provide an art of optical fiber amplifier unit for high reliability in which excitation light sources are formed into a redundant structure, using the same number of excitation light sources as that of a structure lacking in redundancy.

It is another object of the present intention to provide an art of the optical fiber amplifier unit which can supply predetermined amount of excited light power even if characteristics values of the optical parts deviate from the designed values.

The above objects of the invention is achieved by an optical fiber amplifier unit comprising a first fiber amplifier having a first optical fiber and a first wavelength-division multiplexing (WDM) coupler, a second optical fiber amplifier being connected to the first optical fiber amplifier in series and having a second optical fiber and a second WDM coupler, a first excitation light source for outputting excited light to the first and the second optical fiber amplifiers, a second excitation light source for outputting excited light to the first and the second optical fiber amplifiers, and a branching means for inputting an excited light output from the first excitation light source and an excited light output from the second excitation light source, branching them in a predetermined branching ratio that is not even and outputting the branched light to the first and the second WDM couplers, respectively.

The optical fiber amplifier unit of this invention is provided with the first and the second excitation light sources. It is so constructed that each excited light from each excitation light source is input to the branching means where they are subjected to unequal division to be input to the first and the second WDM couplers, respectively. As described above, the excitation light sources are formed into the redundant structure so that excited light is supplied to the optical fiber by one excitation light source as an alternative to the other that gets out of order.

When one excitation light source gets out of order in inputting the excited light, the other normal excitation light source is controlled so as to increase its excited light power to supply the excited light constantly. The redundant structure can be formed from the same number of excitation light sources as that in a unit lacking a redundant structure, which makes sure of outputting signal light.

The optical fiber amplifier units of this invention is characterized by the uneven branching ratio of the branching means. Supposing that the branching ratio is even, that is, 1:1, and excited light powers output from the first and the second excitation light sources are referred to Pa and Pb, each value of the excited light power to be respectively input to the first and the second WDM couplers becomes equal, i.e., $(Pa+Pb)/2$. Therefore, it is impossible to properly adjust the excited light powers to be supplied to the first and the second optical fibers, even if varying values of the excited light powers Pa and Pb. Contrary to this, in the present invention using the uneven branching ratio, for example, $N:(1-N)$ ($N<1$, $N\neq0, 0.5$), the excited light power P1 to be input to the first WDM coupler, and the excited light power P2 to be input to the second WDM coupler are obtained by the following equation (1).

$P1=N\cdot Pa+(1-N)\cdot Pb$ $P2=(1-N)\cdot Pa+N\cdot Pb$ ... (1)

Accordingly, varying excited light powers Pa and Pb enables to adjust the excited light power to be supplied to the first and the second optical fibers.

BRIEF DESCRIPTION OF THE DRAWINGS

Other objects and features of the present invention will be described more detail with reference to the accompanying drawings, in which.

DESCRIPTION OF THE PREFERRED EMBODIMENTS

A first embodiment of the present invention is described hereinafter.

Figure 1:
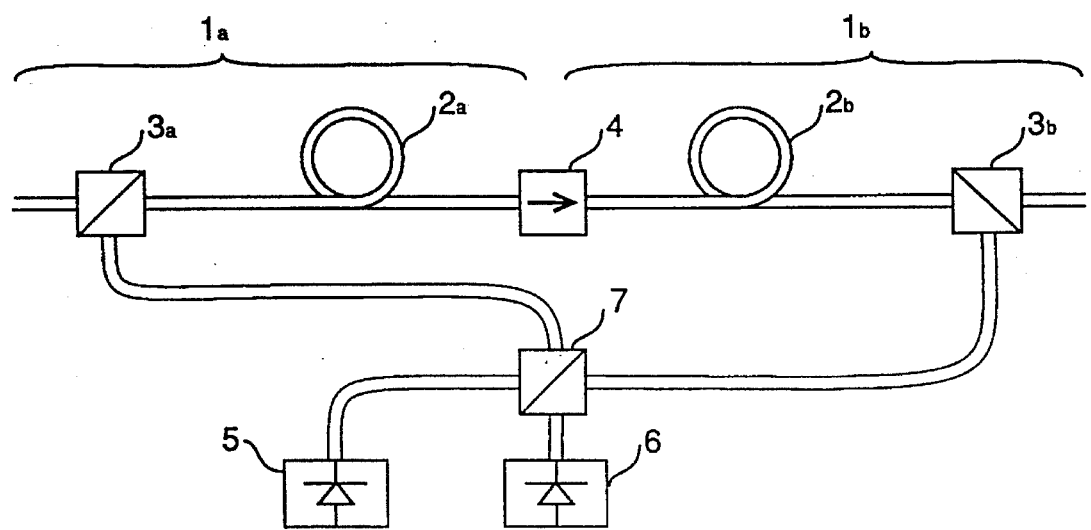
FIG. 1 is a block diagram representing a construction of an optical fiber amplifier unit of a first embodiment of the present invention.

FIG. 1 is a block diagram representing a construction of an optical fiber amplifier unit of the first embodiment.

A reference numeral 1a is a first optical fiber amplifier comprising a first optical fiber 2a made of a quartz glass fiber doped with erbium and a first wavelength-division multiplexing (WDM) coupler 3a.

A reference numeral 1b is a second optical fiber amplifier comprising a second optical fiber 2b made of a quartz glass fiber doped with erbium and a second WDM coupler 3b.

The optical fiber amplifiers 1a and 1b are connected in series via an optical isolator 4.

A reference numeral 5 is a first excitation light source for outputting excited light.

A reference numeral 6 is a second excitation light source for outputting excited light.

A reference numeral 7 is a 2-input/2-output branching means which has two input terminals connected to the excitation light sources 5 and 6, and has two output terminals connected to the WDM couplers 3a and 3b, respectively.

Based on the following equation (2), the 2-input/2-output branching means 7 constructed as above branches the excited light Pa input from the excitation light source 5 into the excited light Pa1 and Pa2, and the excited light Pb input from the excitation light source into the excited light Pb1 and Pb2, respectively.

Pa1: Pa2=N: (1-N)

Pb1: Pb2=(1-N): N    (2)

Where, $N<1$, $N\neq0$, $N\neq0.5$.

The 2-input/2-output branching means 7 supplies the excited light P1 and P2 obtained from the following equation (3) to the WDM couplers 3a and 3b, respectively.

P1=Pa1+Pb1

P2=Pa2+Pb2    ... (3)

The optical fiber amplifier unit constructed as above is described in detail using specific values.

The optical fiber amplifier unit of this embodiment is assumed to be designed to amplify the input light of −20 dBm to +5 dBm. The parameter of the first optical fiber 2a is so set that the output of −5 dBm, i.e., the gain of 15 dB is obtained from the first optical fiber amplifier 1a placed in a front stage. The parameter of the second optical fiber 2b is so set that the output of +5 dBm, i.e., the gain of 10 dB is obtained from the second optical fiber amplifier 1b placed in a rear stage.

At this time, the excited light power required to be input to the excited light input terminal of the WDM coupler 3a is 20 mW and the excited light power required to be input to the excited light input terminal of the WDM coupler 3b is 25 mW.

The excitation light sources 5 and 6 are assumed to have output powers of 31.6 mW and 10.5 mW, respectively. Excessive loss of each input/output path is 0.2 dB (permeability ratio: 95%).

The 2-input/2-output branching means 7 of which branching ratio is 2:3 (–40%:60%) is prepared for supplying the aforementioned excited light power to the WDM couplers 3a and 3b.

Each excited light power input to the WDM couplers 3a and 3b is obtained from the following equation (4).

$$P1=0.95\times(0.4\times31.6+0.6\times10.5)=20$$

$$P2=0.95\times(0.6\times31.6+0.4\times10.5)=25 \qquad (4)$$

Where, P1 represents a value of an excited light power input to the WDM coupler 3a, and P2 represents a value of an excited light power input to the WDM coupler 3b.

As a result, each predetermined amount of excited light power is supplied to each WDM coupler.

It is to be noted that, in case that characteristics values of the optical fibers 2a, 2b and the WDM couplers 3a, 3b deviate from designed values owing to the product dispersion, and it results to change the required values of excited light powers to 21 mW and 24 mW, necessary amount of power can be supplied by adjusting output powers of the excitation light sources 5 and 6.

Contrary to this, supposing that the branching ratio of the 2-input/2-output branching means 7 is 1:1, the ratio of excited light powers to be input to the WDM couplers 2a and 2b is kept constant, irrespective of varying the output power levels of excitation light sources 5 and 6. Consequently the above construction fails to supply the excited light powers of 21 mW and 24 mW to the WDM couplers 2a and 2b, respectively.

The above constructed optical fiber amplifier unit, thus, may cause instability in its operation. To cope with the above-described instable operation, the conventional unit has been required to use optical parts with characteristics closing on designed values, or combination of those optical parts.

The branching ratio of this embodiment is 2:3 (40%:60%), however, it is not limited to such ratio. It may be so set to be, for example, 3:7 (30%:70%), 1.5:1, 2:1 or the like.

Supposing that the branching ratio is set as 3:7 and two outputs from the excitation light sources are referred to Pa and Pb, respective excited light powers supplied to the first and the second optical fiber amplifiers 1a and 1b are obtained from the following equation (5).

$$P1=0.3Pa+0.7Pb$$

$$P2=0.7Pa+0.3Pb \qquad \ldots (5)$$

In this case, respective excited light powers supplied to the WDM couplers are adjustable by varying respective outputs Pa and Pb from the excitation light sources. This mechanism applies to any other cases.

In the first embodiment, the first and the second optical fibers 2a and 2b are made of the quartz glass fiber doped with erbium. Other kind of rare earth elements, however, may be used for forming the optical fiber. Any other materials may be used as the fiber such as multi-component glass, germanium oxide glass, plastics, and the like other than the quartz glass fiber.

A second embodiment is described hereinafter.

The second embodiment is formed into a redundant structure, which is provided with a monitoring means for monitoring output conditions of the excitation light sources 5 and 6.

Figure 2:
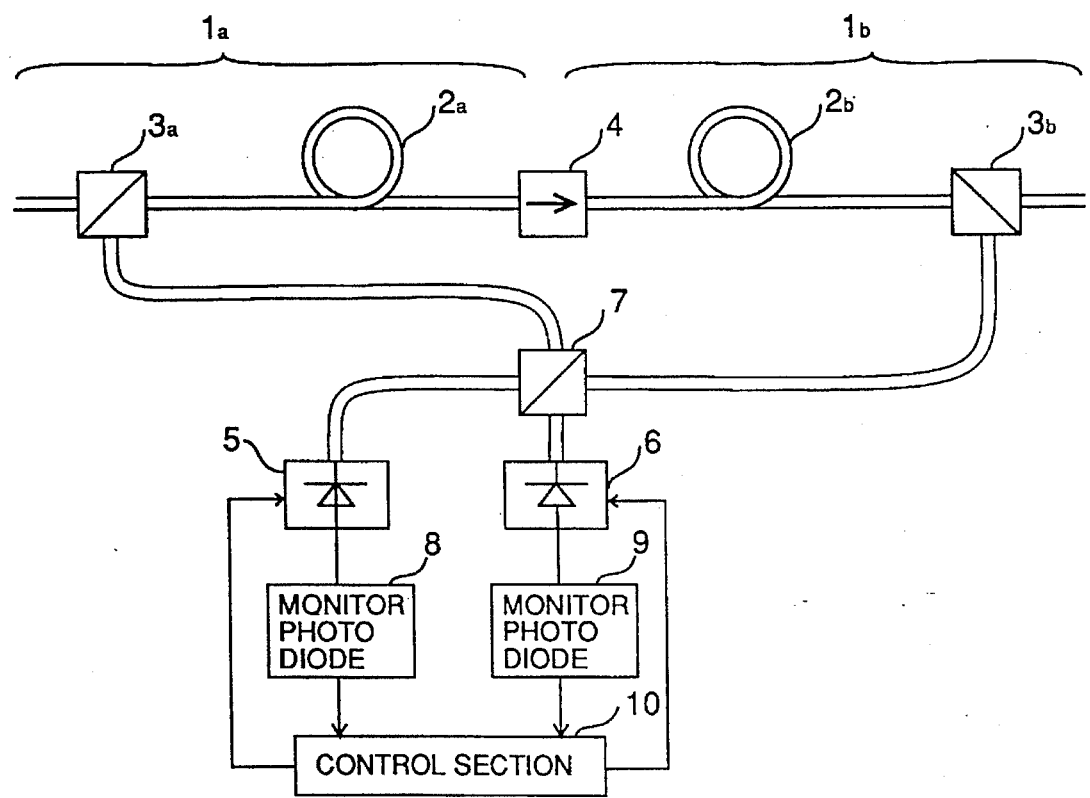
FIG. 2 is a block diagram representing the construction of an optical fiber amplifier unit of a second embodiment of the present invention.
Figure 3:
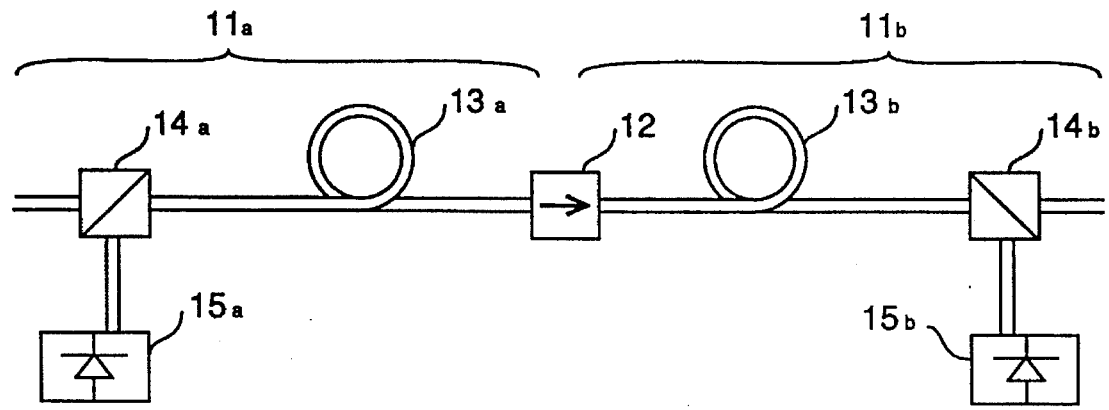
FIG. 3 is a block diagram representing an example of the construction of a conventional two-staged optical fiber amplifier unit.
Figure 4:
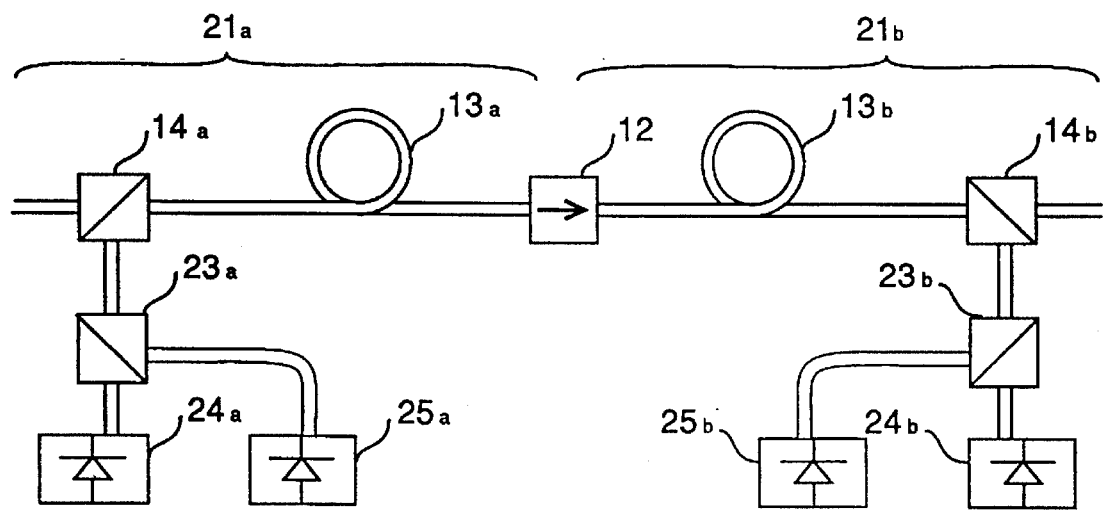
FIG. 4 is a block diagram representing a conventional two-staged optical fiber amplifier unit of which excitation light sources are formed into a redundant structure.
Figure 5:
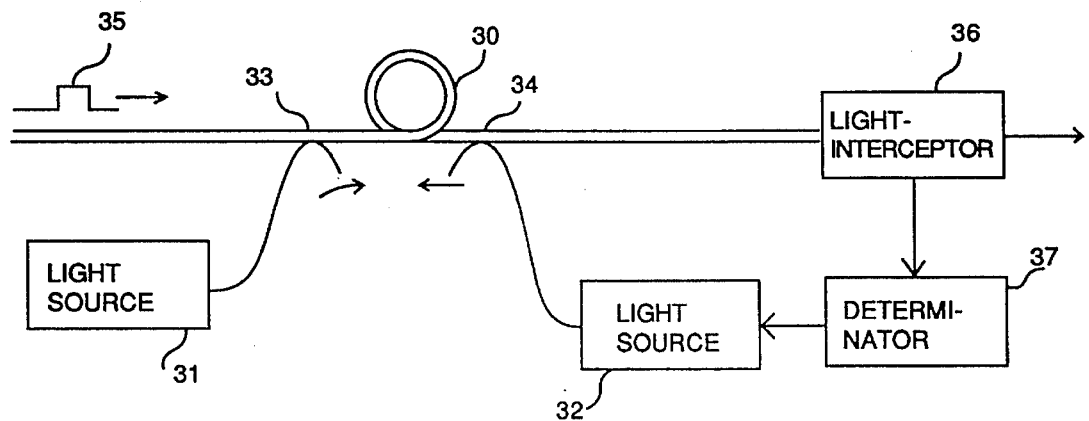
FIG. 5 is a block diagram representing a prior art.
Figure 6:
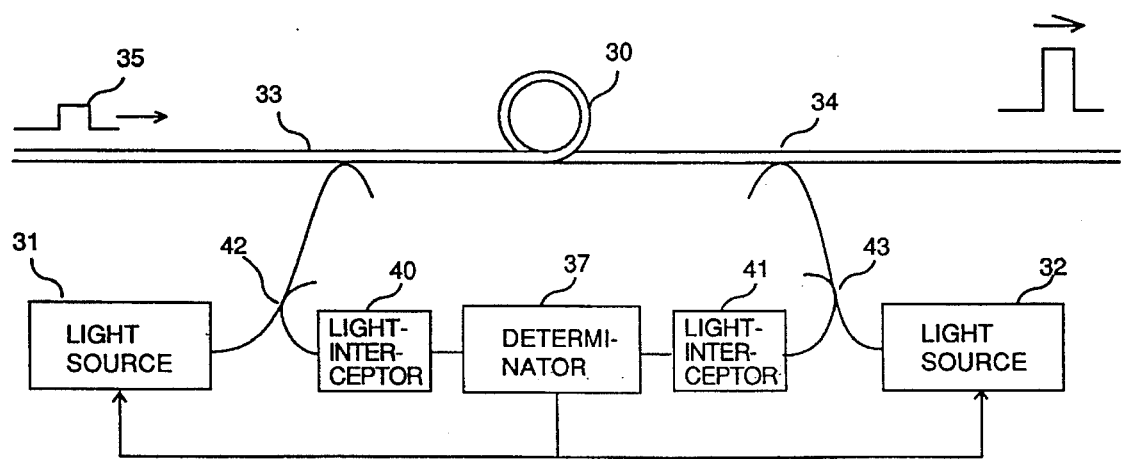
FIG. 6 is a block diagram representing a prior art.

FIG. 2 is a block diagram representing a construction of the optical fiber amplifier unit of the second embodiment. The same components as those in the first embodiment have the same reference numerals, thus omitting their explanations.

A reference numeral 8 is a first monitor photo diode, which receives the light output from one end of the excitation light source 5 in the form of an excitation laser diode to be converted into electric signals. The light output from another end of the excitation laser diode is output to the 2-input/2-output branching means 7.

A reference numeral 9 is a second monitor photo diode which receives the light output from one end of the excitation light source 6 in the form of a excitation laser diode to be converted into electric signals. The light output from another end of the excitation laser diode is output to the 2-input/2-output branching means 7.

A reference numeral 10 is a control section which receives electric signals sent from the monitor photo diodes 8 and 9 and determines whether the predetermined excited light is appropriately output from the excitation light sources 5 and 6.

In the above constructed optical fiber amplifier unit, in case that the excitation light source 5 gets out of order, the light receiving level of the monitor photo diode 8 is lowered. Responding to the signal sent from the monitor photo diode 8, the control section 10 determines that the excitation light source 5 gets in trouble, then increases the output power of the excited light of the excitation light source 6.

In the optical fiber amplifier unit of the second embodiment, even if one excitation light source gets out of order, the other excitation light source can be controlled to increase its excited light output power so as to supply the excited light to two optical fibers 2a and 2b placed at the output side of the 2-input/2-output branching means 7. In the same unit lacking a redundant structure, in case that the excitation light source either 5 or 6 gets out of order, failing to supply the excited light, the corresponded optical fiber becomes an absorber of the optical signal, resulting in outputting no optical signals.

The redundant structure of the optical fiber amplifier unit of the second embodiment enables both optical fibers 2a and 2b to receive excited light, even if only the excitation light source 6 correctly operates.

In such a case, the optical signals amplified with a set gain value can be output.

The first and the second optical fibers 2a and 2b of the second embodiment are made of quartz glass fibers doped with erbium. Other kinds of rare earth elements, however, may be used for forming the optical fiber. Any other materials may be used as the fiber such as multi-component glass, germanium oxide glass, plastic, and the like other than the quartz glass fiber.

What is claimed is:

1. An optical fiber amplifier unit comprising:

a first optical fiber amplifier having a first optical fiber and a first wavelength-division multiplexing couples;

a second optical fiber amplifier being connected to said first optical fiber amplifier in series and having a second optical fiber and a second wavelength-division multiplexing coupler;

a first excitation light source for outputting excited light to said first optical fiber amplifier and said second optical fiber amplifier;

a second excitation light source for outputting excited light to said first optical fiber amplifier and said second optical fiber amplifier; and branching means for inputting excited light output from said first excitation light source and excited light output from said second excitation light source, branching said excited light to said first wavelength-division multiplexing coupler and said second wavelength-division multiplexing coupler in a predetermined branching ratio that is not even.

2. The optical fiber amplifier unit of claim 1, wherein said first optical fiber and said second optical fiber are made of an optical fiber material doped with a rare earth element.

3. The optical fiber amplifier unit of claim 2, wherein said rare earth element is erbium.

4. The optical fiber amplifier unit of claim 1, wherein said branching means inputs, branches and synthesizes excited light output from said first excitation light source and excited light output from said second excitation light source, and outputting resulted light so as to meet the following equations, $$P1 = N \times Pa + (1-N) \times Pb$$

$$P2 = (1-N) \times Pa + N \times Pb$$

where, $N<1$, $N \neq 0$, $N \neq 0.5$, and Pa represents the excited light output from said first excitation light source, Pb represents the excited light output from said second excitation light source, P1 represents excited light output to said first wavelength-division multiplexing coupler, and P2 represents excited light output to said second wavelength-division multiplexing coupler.

5. The optical fiber amplifier unit of claim 1, further comprising:

monitoring means for monitoring a status of output of said first excitation light source and a status of output of said second excitation light source, and informing abnormality when either said first excitation light source or said second excitation light source has been out of order; and increasing means for receiving information from said monitoring means and increasing output level of one of said excitation light sources that is not out of order.

6. The optical fiber amplifier unit of claim 1, further comprising an optical isolator for connecting said first optical fiber amplifier and said second optical fiber amplifier.

7. An optical fiber amplifier unit comprising:

a first fiber amplifier having a first optical fiber doped with a rare earth element and a first wavelength-division multiplexing coupler;

a second optical fiber amplifier being connected to said first optical fiber amplifier in series and having a second optical fiber doped with a rare earth element and a second wavelength-division multiplexing coupler;

an optical isolator for connecting said first optical fiber amplifier and said second optical fiber amplifier;

a first excitation-light source for outputting excited light to said first optical fiber amplifier and said second optical fiber amplifier;

a second excitation light source for outputting excited light to said first optical fiber amplifier and said second optical fiber amplifier; and branching means for inputting excited light output from said first excitation light source and excited light output from said second excitation light source, branching each input excited light in a predetermined branching ratio that is not even, synthesizing one of branched excited light output from said first excitation light source and one of branched excited light output from said second excitation light source, and outputting synthesized excited light to said first wavelength-division multiplexing coupler, simultaneously synthesizing another one of branched excited light output from said first excitation light source and another one of branched excited light output from said second excitation light source, and outputting synthesized excited light to said second wavelength-division multiplexing coupler;

monitoring means for monitoring a status of output of said first excitation light source and a status of output of said second excitation light source, and informing abnormality when either said first excitation light source or said second excitation light source has been out of order; and increasing means for receiving information from said monitoring means and for increasing output level of one of said excitation light sources that is not out of order.

8. The optical fiber amplifier unit of claim 7, wherein said branching means inputs, branches and synthesizes excited light output from said first excitation light source and excited light output from said second excitation light source, and outputting resulted light so as to meet the following equations, $$P1 = N \times Pa + (1-N) \times Pb$$

$$P2 = (1-N) \times Pa + N \times Pb$$

where, $N<1$, $N \neq 0$, $N \neq 0.5$, and Pa represents the excited light output from said first excitation light source, Pb represents the excited light output from said second excitation light source, P1 represents excited light output to said first wavelength-division multiplexing coupler, and P2 represents excited light output to said second wavelength-division multiplexing coupler.

9. An optical fiber amplifier unit comprising:

a first fiber amplifier having a first optical fiber doped with erbium and a first wavelength-division multiplexing coupler;

a second optical fiber amplifier being connected to said first optical fiber amplifier in series and having a second optical fiber doped with erbium and a second wavelength-division multiplexing coupler;

an optical isolator for connecting said first optical fiber amplifier and said second optical fiber amplifier;

a first excitation light source for outputting excited light to said first optical fiber amplifier and said second optical fiber amplifier;

a second excitation light source for outputting excited light to said first optical fiber amplifier and said second optical fiber amplifier; and branching means for inputting excited light output from said first excitation light source and excited light output from said second excitation light source, branching each input excited light in a predetermined branching ratio that is not even, synthesizing one of branched excited light output from said first excitation light source and one of branched excited light output from said second excitation light source, and outputting synthesized excited light to said first wavelength-division multiplexing coupler, simultaneously synthesizing another one of branched excited light output from said first excitation light source and another one of branched excited light output from said second excitation light source, and outputting synthesized excited light to said second wavelength-division multiplexing coupler;

monitoring means for monitoring a status of output of said first excitation light source and a status of output of said second excitation light source, and informing abnormality when either said first excitation light source or said second excitation light source has been out of order; and increasing means for receiving information from said monitoring means and for increasing output level of one of said excitation light sources that is not out of order.

10. The optical fiber amplifier unit of claim 9, wherein said branching means inputs, branches and synthesizes excited light output from said first excitation light source and excited light output from said second excitation light source, and outputting resulted light so as to meet the following equations, $$P1 = N \times Pa + (1-N) \times Pb$$

$$P2 = (1-N) \times Pa + N \times Pb$$

where, $N<1$, $N \neq 0$, $N \neq 0.5$, and Pa represents the excited light output from said first excitation light source, Pb represents the excited light output from said second excitation light source, P1 represents excited light output to said first wavelength-division multiplexing coupler, and P2 represents excited light output to said second wavelength-division multiplexing coupler.

11. A method for supplying excited light to a first optical fiber amplifier and a second optical fiber amplifier that is connected with said first optical fiber amplifier in series comprising:

(a) step of outputting excited light Pa from a first excitation light source;

(b) step of outputting excited light Pb from a second excitation light source;

(c) step of branching said excited light Pa in a predetermined branching ration that is not even into an excited light Pa1 and an excited light Pa2, simultaneously branching said excited light Pb in a predetermined branching ration that is not even into an excited light Pb1 and an excited light Pb2;

(d) step of synthesizing said excited light Pa1 and said excited light Pb1, and supplying this synthesized excited light to said first optical fiber amplifier;

(e) step of synthesizing said excited light Pa2 and said excited light Pb2, and supplying this synthesized excited light to said second optical fiber amplifier.

12. The method for supplying excited light of claim 11, wherein, in said (c) step, said excited light Pa and said excited light Pb are branched so as to meet the following equation, $$Pa1: Pa2 = N: (1-N)$$

$$Pb1: Pb2 = (1-N): N$$

where, $N<1$, $N \neq 0$, $N \neq 0.5$.

13. The method for supplying excited light of claim 11, further comprising:

(f) step of monitoring a status of output of said first excitation light source and a status of output of said second excitation light source, and informing abnormality when either said first excitation light source or said second excitation light source has been out of order; and (g) step of receiving information from said (f) step and increasing output level of one of said excitation light sources that is not out of order.

14. The method for supplying excited light of claim 11, wherein said first optical fiber and said second optical fiber are made of an optical fiber material doped with a rare earth element.

15. The method for supplying excited light of claim 14, wherein said rare earth element is erbium.

16. A method of making an optical fiber amplifier unit comprising the steps of:

determining the pumping power requirements of each of a pair of optical fiber amplifier stages which have a wavelength-division multiplexing coupler, respectively;

providing an excitation light means for creating light energy for pumping optical fiber amplifier stages;

selecting a branching ratio that is not even such that light energy may be distributed to each optical fiber amplifier stage according to its pumping power requirements; and operatively coupling said excitation light amplifier stages via a branching means which distributes the light energy from said excitation light means to each said wavelength-division multiplexing coupler of each of said pair of optical amplifier stages according to said branching ratio which has been selected.

17. A method of making an optical fiber amplifier unit comprising the steps of:

determining the pumping power requirements of a first optical fiber amplifier and a second optical fiber amplifier;

providing a first excitation light source for creating optical pumping energy and a second excitation light source for creating optical pumping energy;

selecting a first branching ratio such that optical pumping energy may be distributed from said first excitation light means to said first and second excitation light means according to the pumping power requirements of each of said first and second optical fiber amplifier stage;

selecting a second branching ratio such that optical pumping energy may be distributed from said second excitation light means according to the pumping power requirements of each of said first and second optical fiber amplifier stage;

operatively coupling said first and second excitation light means to said first and second optical fiber amplifier stages via a branching means which distributes optical pumping energy according to said first and second branching ratios which have been selected.

18. A method according to claim 17, wherein said first optical amplifier stage requires a different amount of optical pumping energy than does said second optical amplifier stage.

19. A method according to claim 17, wherein the mathematical product of said first branching ratio and said second branching ratio is unity.

20. An optical fiber amplifier unit comprising:

a first optical fiber amplifier having a first optical fiber and a first wavelength-division multiplexing coupler;

a second optical fiber amplifier being connected to said first optical fiber amplifier in series and having a second optical fiber and a second wavelength-division multiplexing coupler;

a first excitation light source for outputting excited light to said first optical fiber amplifier and said second optical fiber amplifier;

a second excitation light source for outputting excited light to said first optical fiber amplifier and said second optical fiber amplifier; and branching means for inputting excited light output from said first excitation light source and excited light output from said second excitation light source, branching excited light to said first wavelength-division multiplexing coupler and said second wavelength-division multiplexing coupler from each excitation light source according to a branching ratio that is not even which has been predetermined based upon optical pumping requirements of said first and second optical fiber amplifiers.

* * * * *